United States Patent
Senzaki et al.

(10) Patent No.: US 7,977,030 B2
(45) Date of Patent: Jul. 12, 2011

(54) PHOTOSENSITIVE RESIN COMPOSITION, PHOTOSENSITIVE RESIN LAMINATE, AND METHOD FOR PATTERN FORMING

(75) Inventors: Takahiro Senzaki, Kawsaki (JP); Koichi Misumi, Kawsaki (JP); Koji Saito, Kawsaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/136,354

(22) Filed: Jun. 10, 2008

(65) Prior Publication Data

US 2008/0311511 A1 Dec. 18, 2008

(30) Foreign Application Priority Data

Jun. 15, 2007 (JP) .................. 2007-158320

(51) Int. Cl.
G03F 7/029 (2006.01)
G03F 7/11 (2006.01)
G03F 7/20 (2006.01)
G03F 7/30 (2006.01)
G03F 7/40 (2006.01)

(52) U.S. Cl. ............... 430/280.1; 430/281.1; 430/286.1; 430/287.1; 430/921; 430/925; 430/926; 430/271.1; 430/273.1; 430/325; 430/330

(58) Field of Classification Search .................. None
See application file for complete search history.

(56) References Cited

U.S. PATENT DOCUMENTS

| 6,313,188 B1 * | 11/2001 | Takahashi ........................ 522/25 |
| 2004/0152857 A1 * | 8/2004 | Ohnishi et al. ................ 527/301 |
| 2006/0188820 A1 * | 8/2006 | Maeda ........................... 430/311 |

FOREIGN PATENT DOCUMENTS

| JP | S62-102242 A | 5/1987 |
| JP | H7-78628 B2 | 8/1995 |
| JP | H10-147608 | 6/1998 |
| JP | 2003-212956 A | 7/2003 |
| JP | 2005-55865 | 3/2005 |
| WO | WO2005/093514 A1 * | 10/2005 |
| WO | WO2008/007764 A1 * | 1/2008 |

OTHER PUBLICATIONS

Derwent English abstract for WO 2008/007764 A1.*
Notice of Reasons for Rejection issued to corresponding KR Application No. 10-2008-0048534, mailed Oct. 20, 2010.

* cited by examiner

Primary Examiner — Sin J. Lee
(74) Attorney, Agent, or Firm — Knobbe, Martens, Olson & Bear, LLP

(57) ABSTRACT

A photosensitive resin composition, a photosensitive resin laminate, and a method for forming a pattern capable of realizing high hardness while using an epoxy group-containing acrylic resin are provided. In a photosensitive resin composition including (A) an epoxy group-containing acrylic resin, (B) a photopolymerization initiator, and (C) a sensitizer, an onium salt having a specific structure is used as the component (B), and at least one kind selected from 1,5-dihydroxynaphthalene, 2,3-dihydroxynaphthalene, and 2,6-dihydroxynaphthalene is used as the component (C).

5 Claims, No Drawings

PHOTOSENSITIVE RESIN COMPOSITION, PHOTOSENSITIVE RESIN LAMINATE, AND METHOD FOR PATTERN FORMING

RELATED APPLICATION

This application claims priority under 35 U.S.C. §119 (a)-(d) to Japanese Patent Application No. 2007-158320, filed on Jun. 15, 2007, the content of which is incorporated herein by reference.

BACKGROUND OF THE INVENTION

1. Field of the Invention

The present invention relates to a photosensitive resin composition, a photosensitive resin laminate, and a method for forming a pattern. More particularly, the present invention relates to a photosensitive resin composition, a photosensitive resin laminate, and a method for forming a pattern which are suitably used to manufacture a circuit board and electronic components such as a chip size package (CSP) mounted on the circuit board, a micro-electromechanical system (MEMS) element and a micro machine incorporated with the MEMS element, and a through-hole electrode for implementing high-density packaging.

2. Related Art

Photofabrication, which is now the mainstream of a microfabrication technique, is a generic term describing the technology used for manufacturing a wide variety of precision components, such as semiconductor packages and MS elements. The manufacturing is carried out by applying a photosensitive resin composition to the surface of a processing target to form a coating, patterning this coating using photolithographic techniques, and then conducting electroforming based mainly on chemical etching or electrolytic etching, and/or electroplating, using the patterned coating as a mask.

Conventionally, as photosensitive resin compositions used in such photofabrication, a photosensitive resin composition containing an epoxy resin and an acid generator have been known. For example, photosensitive resin compositions containing an epoxy-functional novolac resin, an acid generator such as triarylsulfonium salts, and a diluent capable of reacting with an epoxy group are disclosed (see Japanese Examined Patent Application Publication No. H07-78628). Furthermore, photosensitive resin compositions containing an epoxy group-containing acrylic resin obtained by further reacting reaction products of hydroxy group-containing (meth)acrylate and acid anhydride with an epoxy resin, and a photopolymerization initiator are also disclosed (see Japanese Unexamined Patent Application Publication No. 2003-212956).

SUMMARY OF THE INVENTION

However, an epoxy group-containing acrylic resin has essentially been used to add flexibility and toughness to hardened materials, and thus has not been applied for high hardness. Therefore, there has been a problem in that photosensitive resin compositions containing an epoxy group-containing acrylic resin are not preferable for forming a permanent film requiring high hardness.

The present invention has been made in view of the above-mentioned problem, and aims at providing a photosensitive resin composition, a photosensitive resin laminate, and a method for forming a pattern capable of realizing high hardness while using an epoxy group-containing acrylic resin.

The present inventors have thoroughly researched to accomplish the above goal, have found that the above described problem can be solved by including a specific photopolymerization initiator and a specific sensitizer in photosensitive resin compositions containing an epoxy group-containing acrylic resin, and have accomplished the present invention. In particular, the present invention provides the following.

In a first aspect of the present invention, a photosensitive resin composition includes (A) an epoxy group-containing acrylic resin, (B) a photopolymerization initiator, and (C) a sensitizer, in which the photosensitive resin composition is characterized in that the component (B) includes an onium salt represented by following general formula (b1):

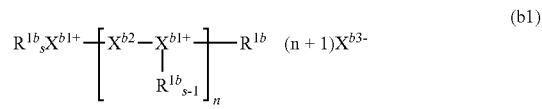

(In the formula (b1), $X^{b1}$ represents a sulfur atom or an iodine atom of valence s, s being 1 or 2. n represents a repeating unit of the structure in parenthesis, $R^{1b}$ represents a substituted or unsubstituted aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms which bind to $X^{b1}$ (at least two $R^{1b}$ may directly or indirectly bind with each other to form a ring structure including $X^{b1}$), $X^{b2}$ represents a substituted or unsubstituted divalent chain group including an alkylene group having 1 to 8 carbon atoms, an arylene group having 6 to 20 carbon atoms, or a heterocyclic structure having 8 to 20 carbon atoms, and $X^{b3-}$ represents a fluorine-containing phosphate anion or a fluorine-containing antimonate anion having 1 to 10 carbon atoms), and the component (C) is at least one selected from 1,5-dihydroxynaphthalene, 2,3-dihydroxynaphthalene, and 2,6-dihydroxynaphthalene.

In a second aspect of the present invention, a photosensitive resin laminate is constituted by forming protective layers on both sides of a photosensitive resin layer formed from a photosensitive resin composition of the present invention.

In a third aspect of the present invention, a method for forming a pattern is characterized in that a cured resin pattern of a predetermined shape is obtained by applying a photosensitive resin composition of the present invention on a support, drying, and then exposing a photosensitive resin composition layer to a predetermined pattern, followed by heat-treating the resin pattern obtained by development.

In a forth aspect of the present invention, a method for forming a pattern is characterized in that a cured resin pattern of a predetermined shape is obtained by removing protective layers from both sides of a photosensitive resin laminate of the present invention, and adhering thereof on a support, exposing a photosensitive resin layer to a predetermined pattern, followed by heat-treating the resin pattern obtained by development.

In a fifth aspect of the present invention, a method for forming a pattern is characterized in that a cured resin pattern of a predetermined shape is obtained by removing a protective layer from one side of a photosensitive resin laminate of the present invention, adhering the photosensitive resin laminate on a support so that the exposed photosensitive resin layer contacts the support, exposing the photosensitive resin layer to a predetermined pattern, then removing a protective layer on the another side of the photosensitive resin laminate, and heat-treating the resin pattern obtained by development.

According to a photosensitive resin composition and a photosensitive resin laminate of the present invention, a resin pattern having high hardness can be formed by containing an epoxy-functional novolac resin, a specific photopolymerization initiator and a sensitizer.

DETAILED DESCRIPTION OF THE INVENTION

Photosensitive Resin Composition

A photosensitive resin composition according to the present invention includes (A) an epoxy group-containing acrylic resin, (B) a photopolymerization initiator, and (C) a sensitizer. Hereinafter, each component contained in a photosensitive resin composition according to the present invention is described.

(A) Epoxy Group-Containing Acrylic Resin

As (A) an epoxy group-containing acrylic resin (hereinafter, referred to as a component (A)), conventionally-known resins can be used without particular limitation. Such a component (A) includes, for example, a resin obtainable by reacting a epoxy resin with (meth)acrylate, and such epoxy resin includes a resin such as a bisphenol A type epoxy resin, a bisphenol F type epoxy resin, a bisphenol S type epoxy resin, a phenol or cresolnovolac type epoxy resin, a cresol type epoxy resin, triphenolmethane type epoxy resin, a polyglycidyl polycarboxylate, a polyol polyglycidyl ether, a fatty or alicyclic epoxy resin, an aminoepoxy resin, and a dihydroxybenzene type epoxy resin. The component (A) further includes a resin containing (meth)acrylic compound having an epoxy group as a structural monomer.

Among them, a resin containing a (meth)acrylic compound represented by the following general formulae (a1) to (a4) as a structural monomer is preferable.

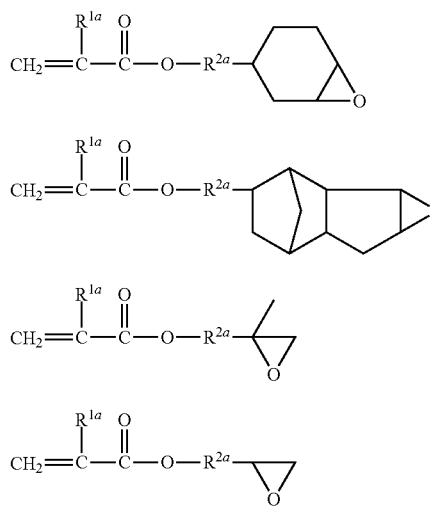

(In the formulae (a1) to (a4), $R^{1a}$ represents a hydrogen atom or a methyl group, and $R^{2a}$ represents a single bond or an alkylene group having 1 to 3 carbon atoms.)

In the above general formulae (a1) to (a4), $R^{2a}$ is a single bond or an alkylene group having 1 to 3 carbon atoms, and particularly preferably a single bond.

The component (A) preferably has a weight-average molecular weight of 1000 to 20000, and more preferably 5000 to 10000. By setting the above range, a high viscosity can be obtained with an appropriate solid concentration, and also uniformity in application and developability can become favorable. The content of the component (A) is preferably 40 to 99% by mass with respect to the solid content of the photosensitive resin composition, and more preferably 80 to 99% by mass. By setting the above range, the photosensitive resin composition achieves high sensitivity, and a cured resin pattern with high hardness can be obtained.

(B) Photopolymerization Initiator (B) A photopolymerization initiator (hereinafter referred to as component (B)) includes onium salt represented by the following general formula (b1):

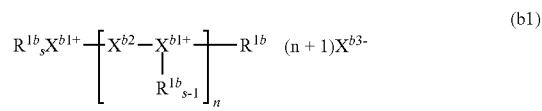

(In the formula (b1), $X^{b1}$ represents a sulfur atom or an iodine atom of valence s, s being 1 or 2. n represents the number of repeating units of the structure in parenthesis, $R^{1b}$ represents a substituted or unsubstituted aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, which binds to $X^{b1}$ (at least two $R^{1b}$ may directly or indirectly bind with each other to form a ring structure including $X^{b1}$), $X^{b2}$ represents a substituted or unsubstituted divalent chain group including an alkylene group having 1 to 8 carbon atoms, an arylene group having 6 to 20 carbon atoms, or a heterocyclic structure having 8 to 20 carbon atoms, and $X^{b3-}$ represents a fluorine-containing phosphate anion or a fluorine-containing antimonate anion having 1 to 10 carbon atoms.)

In the above general formula (b1), if $R^{1b}$ has a substituent, it is preferable that the substituent is at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and a halogen atom.

In the above general formula (b1), if at least two $R^{1b}$ indirectly bind with each other, it is preferable that at least two $R^{1b}$ are bound via —O—, —S—, —SO—, —SO$_2$—, —NH—, —NR$^{4b}$—, —CO—, —COO—, —CONH— an alkylene group having 1 to 3 carbon atoms, or a phenylene group. $R^{4b}$ represents an alkyl group having 1 to 5 carbon atoms or an aryl group having 6 to 10 carbon atoms.

$X^{b2}$ in the above general formula (b1) can be represented by following general formula (b7).

In the above general formula (b4), $X^{b5}$ represents an alkylene group having 1 to 8 carbon atoms, an arylene group having 6 to 20 carbon atoms, or a divalent group including a heterocyclic compound having 8 to 20 carbon atoms, $X^{b5}$ may be substituted by at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and a halogen atom. $X^{b6}$ represents —O—, —S—, —SO—, —SO$_2$—, —NH—, —NR$^{4b}$—, —CO—, —COO—, —CONH—, an alkylene group having 1 to 3 carbon atoms, or a phenylene group m represents the number of repeating units of the structure in parenthesis.m+1 of $X^{b5}$ and m of $X^{b6}$ may be the same or different. The definition of $R^{4b}$ is the same as that described above.

$X^{b3-}$ in the above general formula (b1) can include one represented by the following general formula (b8) other than SbF$_6^-$ and PF$_6^-$.

$$[(R^{5b})_v PF_{6-v}]^- \tag{b8}$$

In the general formula (b5), $R^{5b}$ represents an alkyl group in which a portion or all hydrogen atoms are substituted by a fluorine atom. The number of carbon atoms is preferably 1 to 8, and the more preferable number of carbon atoms is 1 to 4. An alkyl group may be any of linear, branched, or cyclic. The ratio by which hydrogen atoms of the alkyl group are substituted by a fluorine atom is generally at least 80%, preferably at least 90%, and more preferably 100%. If the substitution rate of hydrogen atoms by fluorine atoms is no more than 80%, an acid strength of onium salt represented by the above general formula (b1) decreases. The particularly preferable $R^{5b}$ is linear or branched perfluoroalkyl having 1 to 4 carbon atoms and the substitution rate of hydrogen atoms with fluorine atoms is 100%. Concrete examples thereof can include CF$_3$, CF$_3$CF$_2$, (CF$_3$)$_2$CF, CF$_3$CF$_2$CF$_2$, CF$_3$CF$_2$CF$_2$CF$_2$, (CF$_3$)$_2$CFCF$_2$, CF$_3$CF$_2$(CF$_3$)CF, and (CF$_3$)$_3$C. The number v of $R^{5b}$ is 1 to 6, preferably 2 to 6, and v units of $R^{5b}$ may be the same or different.

In the above general formula (b1), preferred concrete examples of the cation portion include triphenylsulfonium, tri-p-trisulfonium, 4-(phenyltio)phenyldiphenylsulfonium, bis-[4-(diphenylsulfonio)phenyl]sulfide, bis-[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenyltio)phenylbis(4-fluorophenyl)sulfonium, 4-(4-benzoylphenyltio)phenyldiphenylsulfonium, 7-isopropyl-9-oxo-10-thia-9,10-dihydroanthracene-2-yldi-p-tolylsulfonium, 7-isopropyl-9-oxo-10-thia-9,10-dihidroanthracene-2-yldiphenylsulfonium, 2-[(diphenyl)sulfonio]tioxanthone, 4-[4-(4-tert-butylbenzoyl)phenyltio]phenyldi-p-tolylsulfonium, 4-(4-benzoylphenyltio)phenyldiphenylsulfonium, diphenylphenacylsulfonium, 4-hydroxyphenylmethylbenzilsulfonium, 2-naphthylmethyl(1-ethoxycarbonyl)ethylsulfonium, 4-hydroxyphenylmethyphenacylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenyliodonium, 4-isopropylphenyl(p-tolyl)iodonium, and 4-isobutylphenyl(p-tolyl)iodonium.

On the other hand, in the above general formula (b1), preferred concrete examples of the anion portion represented by the above general formula (b8) include [(CF$_3$CF$_2$)$_2$PF$_4$]$^-$, [(CF$_3$CF$_2$)$_3$PF$_3$]$^-$, [((CF$_3$)$_2$CF)$_2$PF$_4$]$^-$, [((CF$_3$)$_2$CF)$_3$PF$_3$]$^-$, [(CF$_3$CF$_2$CF$_2$)$_2$PF$_4$]$^-$, [(CF$_3$CF$_2$CF$_2$)$_3$PF$_3$]$^-$, [((CF$_3$)$_2$CFCF$_2$)$_2$PF$_4$]$^-$, [((CF$_3$)$_2$CFCF$_2$)$_3$PF$_3$]$^-$, [(CF$_3$CF$_2$CF$_2$CF$_2$)$_2$PF$_4$]$^-$, and [(CF$_3$CF$_2$CF$_2$)$_3$PF$_3$]$^-$. Among them, [(CF$_3$CF$_2$)$_3$PF$_3$]$^-$, [(CF$_3$CF$_2$CF$_2$)$_3$PF$_3$]$^-$, [((CF$_3$)$_2$CF)$_3$PF$_3$]$^-$, [((CF$_3$)$_2$CF)$_2$PF$_4$]$^-$, [((CF$_3$)$_2$CFCF$_2$)$_3$PF$_3$]$^-$, and [((CF$_3$)$_2$CFCF$_2$)$_2$PF$_4$]$^-$ are particularly preferred.

One particularly preferred example of an onium salt represented by the above general formula (b1) includes diphenyl[4-(phenyltio)phenyl]sulfonium trifluorotrisfluoroalkylphosphate represented by the following general formula (b2) and diphenyl[4-(phenyltio)phenyl]sulfonium tetrafluoroalkylphosphate represented by the following general formula (b3).

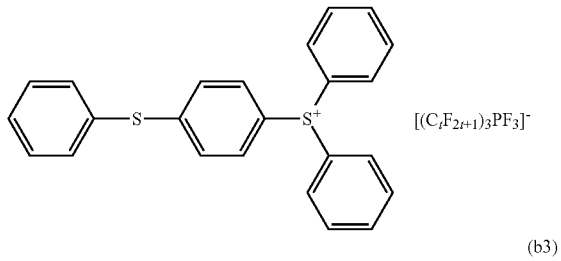

(b2)

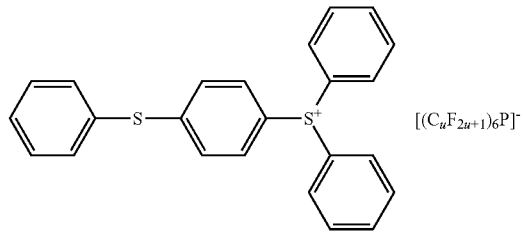

(b3)

In the above general formulae (b2) and (b3), t and u represent integers of 1 to 8, and preferably integers of 1 to 4.

Furthermore, another particularly preferred example of an onium salt represented by the above general formula (b1) includes the one represented by the following general formula (b4).

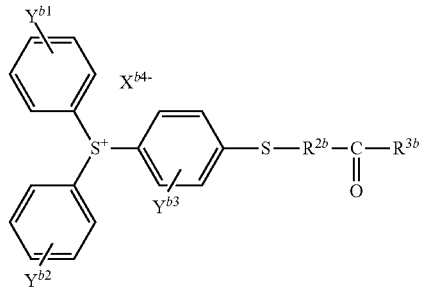

(b4)

In the general formula (b4), $R^{2b}$ represents a substituted or unsubstituted arylene group having 6 to 20 carbon atoms, $R^{3b}$ represents a substituted or unsubstituted aryl group having 6 to 30 carbon atoms, $Y^{b1}$, $Y^{b2}$, and $Y^{b3}$ represent a hydrogen atom or a halogen atom, and $X^{b4-}$ represents SbF$_6^-$ or PF$_6^-$.

Among the onium salts represented by the above general formula (b4), the ones where $R^{2b}$ is represented by the following general formula (b5):

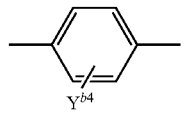

(b5)

(In the formula (b5), $Y^{b4}$ represents a hydrogen atom or a halogen atom); and $R^{3b}$ is represented by the following general formula (b6):

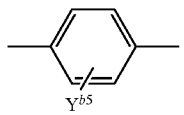

(b6)

(In the formula (b6), $Y^{b5}$ represents a hydrogen atom or a halogen atom) are preferred.

The most preferable example among onium salts represented by the above general formula (b4) includes 4-(2-chloro-4-benzoylphenylthio)phenylbis(4-fluorophenyl)sulfonium hexafluoroantimonate.

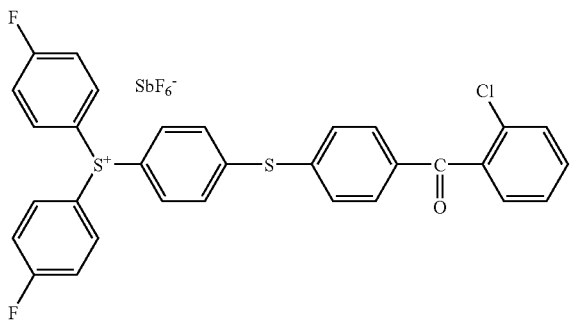

(b9)

The component (B) described above may be used solely or in combination of two or more thereof. Moreover, the component (B) may be used in combination with a conventionally known photopolymerization initiator. If a conventionally known photopolymerization initiator is used in combination with the component (B), the usage ratio thereof can be arbitrary. However, another photopolymerization initiator is typically 1 to 10 parts by mass, and preferably 3 to 5 parts by mass with respect to 100 parts by mass of onium salt represented by the above general formula (b1).

The content of the component (B) is preferably 0.01 to 20 parts by mass with respect to 100 parts by mass of the above component (A). When the component (B) is contained in an amount of at least 0.01 parts by mass, sufficient sensitivity can be obtained, and when lesson more than 20 parts by mass, resolvability to a solvent increases to be able to obtain a uniform solution, resulting in a tendency of improvement of preservation stability.

(C) Sensitizer

Sensitizer (C) (hereinafter referred to a component (C)) is at least one selected from 1,5-dihydroxynaphthalene, 2,3-dihydroxynaphthalene, and 2,6-dihydroxynaphthalene. The sensitization action of such a component (C) can result in high sensitivity of a photosensitive resin composition. Moreover, because the component (C) has two hydroxyl groups which are capable of cross-linking with an epoxy group of the component (B), the crosslink density of the component (B) can be improved, and a film itself formed from photosensitive resin layer can be highly densified, resulting in a photosensitive resin layer with high hardness. The component (C) may be used solely or in combination of two or more thereof.

The content of the component (C) is 0.01 to 40 parts by mass with respect to 100 parts by mass of the above component (A). This results in obtaining a desired effect without deterioration of a pattern shape.

(D) Solvent

The photosensitive resin composition of the present invention is preferably used in the form of a solution in which each of the above components is dissolved in a (D) solvent (hereinafter referred to as a component (D)). A conventionally known solvent can be used as the component (D) without specific limitation. For example, the component (D) includes γ-butyrolactone, ethyl lactate, propylenecarbonate, propylene glycol monomethylether acetate, methyl isobutyl ketone, butyl acetate, methylamylketone, 2-heptanone, ethyl acetate, methyl ethyl ketone, and the like. Among them, γ-butyrolactone, ethyl lactate, and propylenecarbonate can be used preferably. The component (D) may be used solely or in combination of two or more thereof.

In consideration of application properties, a usage amount of the component (D) is preferably in such a range as to be 30 to 70% by mass of solid concentration.

Other Components

From the standpoint that the photosensitive resin composition of the present invention improves flexibility of the photosensitive resin composition before curing without lowering the properties of the photosensitive resin after curing, oxetane derivatives and epoxy derivatives may be contained. In addition, conventionally known agents of miscible additives, for example, additive resins, plasticizers, stabilizers, coloring agents, leveling agents, coupling agents, and the like for improving patterning efficiency, can be appropriately contained, if desired. For example, with respect to 100 parts by mass of the above component (A), 0.5 to 30 parts by mass of a coupling agent of epoxy type, and 0.01 to 1 part by mass of a leveling agent can be contained.

Method for Preparing Photosensitive Resin Composition

A method for preparing the photosensitive resin composition of the present invention is, for example, only mixing and stirring each of the aforementioned components by a conventional method. Each of the aforementioned components may be dispersed and mixed using dispersion equipment such as a dissolver, a homogenizer, or a three-roll mill, if necessary. In addition, the components may further be filtrated using a mesh, a membrane filter, or the like after mixing them.

Photosensitive Resin Laminate

A photosensitive resin composition of the present invention may be used in a form of a solution, but may be used in a form of a photosensitive resin laminate by forming protective layers on both sides of a photosensitive resin layer which is formed from a photosensitive resin composition. This photosensitive laminate allows for application on a support and a drying step to be eliminated, and the formation of a pattern can be simpler. As the protective layer for the photosensitive resin composition, it is preferable to use any of polymeric films such as polyethylene terephthalate film, polypropylene film, and polyethylene film.

Method for Pattern Forming

If the photosensitive resin composition of the present invention is used in a form of a solution, a cured resin pattern of a predetermined shape can be obtained by the following steps: applying the photosensitive resin composition on a support using a spincoater and the like, and drying a photosensitive resin layer; exposing the photosensitive resin layer to a predetermined pattern using an active ray, radiation or the like; then carrying out development; and heat-treating the resultant resin pattern.

On the other hand, if the photosensitive resin composition of the present invention is used in a form of a photosensitive resin laminate, a cured resin pattern of a predetermined shape can be obtained by the following steps: removing protective films from both sides of the photosensitive resin laminate and adhering the protective films on a support; exposing a photosensitive resin layer to a predetermined pattern, then carrying out development; and heat-treating the resultant resin pattern. Meanwhile, a protective film on one of the surfaces of the photosensitive resin laminate can be removed instead of removing the protective films from both sides of the photosensitive resin laminate. In this case, the other side of the protective film can be removed after adhering the photosensitive resin laminate on a support so that the exposed photosensitive resin layer contacts the support, and the photosensitive resin layer exposed to a predetermined pattern.

There is especially no limitation on a support and conventionally known materials can be used. For example, an electronic substrate, an electronic substrate on which a predetermined wiring pattern is formed, and the like can be exemplified. This substrate includes a substrate made of metals such as titanium, tantalum, palladium, titanium-tungsten, copper, chrome, iron, aluminum, and the like, and silicon, silicon nitride, and a glass substrate, and the like. As materials for a wiring pattern, for example, copper, soft solder, chrome, nickel, gold, and the like can be used.

EXAMPLES

Examples of the present invention are described below; however, the scope of the invention is not intended to be limited by these examples.

Examples 1 to 5 and Comparative Example 1

According to the blending (unit: parts by mass) described in Table 1, the photosensitive resin compositions, blended with the epoxy group-containing acrylic resin, the photopolymerization initiator, the sensitizer, and the solvent, were obtained.

These photosensitive resin compositions were applied to five inches of the silicon wafer by way of a spincoater, and then dried, thereby obtaining a photosensitive resin layer having a film thickness of 30 μm. This photosensitive resin layer was pre-baked on a hotplate at 60° C. for 5 minutes and at 90° C. for 10 minutes. After pre-baking, a pattern exposure (soft contact, GHI ray) was carried out using a PLA-501F (contact aligner: manufactured by Cannon), and post exposure heating (PEB) was carried out using a hotplate at 90° C. for 5 minutes. Then, a development process was carried out for 8 minutes by a dipping method using propylene glycol monoethyl ether acetate (PGMEA). Subsequently, the resin pattern after development was post-baked together with the wafer using an oven at 200° C. for one hour to obtain a cured resin pattern.

Evaluation

As an evaluation of the hardness of the cured resin pattern, Young's modulus and Vickers hardness were measured. Measurement was carried out using a Fischerscope HM2000 hardness tester (manufactured by Fischer Instruments), by applying load at room temperature at the rate of 4 mN/second in a thickness direction for 10 seconds until the push-in depth became 8 μm, and holding for 5 seconds.

TABLE 1

| Blending | | Example | | | | | Comparative Example |
|---|---|---|---|---|---|---|---|
| Components | | 1 | 2 | 3 | 4 | 5 | 1 |
| Epoxy Group- | A-1 | 100 | | | 100 | | |
| containing Acrylic | A-2 | | 100 | | | 100 | |
| Resin | A-3 | | | 100 | | | 100 |
| Photopolymerization | B-1 | 3 | 3 | 3 | | | |
| Initiator | B-2 | | | | 3 | 3 | |
| | B-3 | | | | | | 3 |
| Sensitizer | C-1 | 1 | 1 | 1 | | | 1 |
| | C-2 | | | | 1 | | |
| | C-3 | | | | | 1 | |
| Solvent | D | 50 | 50 | 50 | 50 | 50 | 50 |
| Young's Modulus (MPa) | | 4300 | 3980 | 4220 | 4350 | 4110 | 3320 |
| Vickers Hardness (N/mm²) | | 33.7 | 30.6 | 32 | 34 | 31.2 | 23.4 |

(A-1): Resin constituted with a structural monomer represented by the following chemical formula (1) (mass average molecular weight: 8000)

(1)

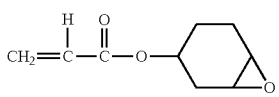

(A-2): Resin constituted with a structural monomer represented by the above chemical formula (1) and the following chemical formula (2) (mass average molecular weight: 8000, (1):(2) = 80:20 (molar ratio))

(2)

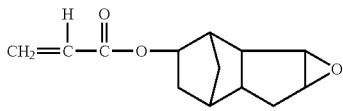

TABLE 1-continued

| Blending | Example | | | | | Comparative Example |
|---|---|---|---|---|---|---|
| Components | 1 | 2 | 3 | 4 | 5 | 1 |

(A-3): Resin constituted with a structural monomer represented by the above chemical formula (1) and the following chemical formula (3) (mass average molecular weight: 8000, (1):(3) = 80:20 (molar ratio))

(3)

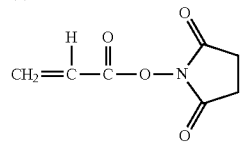

(B-1): Diphenyl[4-(phenyltio)phenyl]sulfonium trifluorotrispentafluoroethylphosphate
(B-2): 4-(2-chloro-4-benzoylphenylthio)phenylbis(4-fluorophenyl)sulfonium hexafluororoantimonate
(B-3): Diphenyl[4-(phenyltio)phenyl]sulfonium hexafluoroantimonate
(C-1): 1,5-dihydroxynaphthalene
(C-2): 2,3-dihydroxynaphthalene
(C-3): 2,6-dihydroxynaphthalene
(D): γ-butyrolactone As shown in Table 1, if the photosensitive resin compositions of Examples 1 to 5 containing diphenyl[4-(phenyltio)phenyl]sulfonium trifluorotrispentafluoroethylphosphate or 4-(2-chloro-4-benzoylphenylthio)phenylbis(4-fluorophenyl)sulfonium hexafluororoantimonate, which is a photopolymerization initiator represented by the above general formula (b1), and 1,5-dihydroxynaphthalene, 2,3-dihydroxynaphthalene, or 2,6-dihydroxynaphthalene are used together with an epoxy group-containing acrylic resin, a cured resin pattern with high hardness could be obtained. On the other hand, if the photosensitive resin compositions of Comparative Example 1, in which diphenyl[4-(phenyltio)phenyl]sulfonium hexafluoroantimonate was used as a photopolymerization initiator, was used, the hardness was inferior.

What is claimed is:

1. A photosensitive resin composition comprising: (A) an epoxy group-containing acrylic resin; (B) a photopolymerization initiator; and (C) a sensitizer,
   wherein the photopolymerization initiator (B) is an onium salt represented by the following general formula (b2):

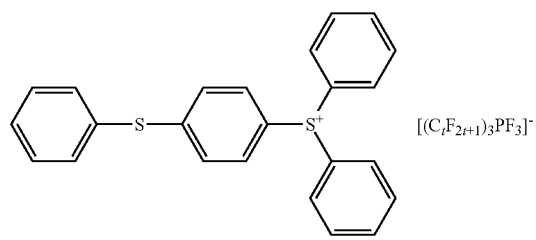

(b2)

wherein t represents an integer between 1 and 8, and the sensitizer (C) is at least one compound selected from the group consisting of 1,5-dihydroxynaphthalene, 2,3-dihydroxynaphthalene and 2,6-dihydroxynaphthalene.

2. A photosensitive resin laminate configured by forming protective layers on both sides of a photosensitive resin layer formed from the photosensitive resin composition according to claim 1.

3. A method for forming a pattern, wherein a cured resin pattern of a predetermined shape is obtained by removing protective layers from both sides of the photosensitive resin laminate according to claim 2, adhering the protective layers on a support, exposing a photosensitive resin layer to a predetermined pattern, followed by heat-treating a resin pattern obtained by development.

4. A method for forming a pattern, wherein a cured resin pattern of a predetermined shape is obtained by removing a protective layer from one side of the photosensitive resin laminate according to claim 2, adhering the photosensitive resin laminate on a support so that the exposed photosensitive resin layer contacts the support, exposing the photosensitive resin layer to a predetermined pattern, then removing a protective layers on the another side of the photosensitive resin laminate, and heat-treating a resin pattern obtained by development.

5. A method for forming a pattern, wherein a cured resin pattern of a predetermined shape is obtained by applying a photosensitive resin composition according to claim 1 to a support, drying, and exposing to a predetermined pattern, followed by heat-treating the resin pattern obtained by development.

* * * * *